United States Patent [19]

Ahn et al.

[11] 4,243,476
[45] Jan. 6, 1981

[54] MODIFICATION OF ETCH RATES BY SOLID MASKING MATERIALS

[75] Inventors: Kie Y. Ahn, Chappaqua; Daniel E. Cox, Ossining, both of N.Y.

[73] Assignee: International Business Machines Corporation, Armonk, N.Y.

[21] Appl. No.: 53,488

[22] Filed: Jun. 29, 1979

[51] Int. Cl.³ ............................................. C23F 1/00
[52] U.S. Cl. .................................... 156/643; 156/646; 156/662; 156/664; 204/192 E
[58] Field of Search ............... 156/643, 646, 662, 653, 156/664; 204/192 E

[56] References Cited

U.S. PATENT DOCUMENTS

| | | | |
|---|---|---|---|
| 3,615,956 | 10/1971 | Irving et al. | 156/646 |
| 3,705,060 | 12/1972 | Stork | 29/578 |
| 3,816,196 | 6/1974 | Lacombe | 156/668 |
| 3,816,198 | 6/1974 | Lacombe et al. | 156/668 |
| 3,867,216 | 2/1975 | Jacob | 252/79.1 |
| 3,994,793 | 11/1976 | Harvilchuck et al. | 204/192 E |
| 4,057,460 | 11/1977 | Saxena et al. | 204/192 E |
| 4,069,096 | 1/1978 | Reinberg et al. | 204/192 E |
| 4,085,022 | 4/1978 | Wechsung | 204/192 E |
| 4,092,210 | 5/1978 | Hoepfner | 156/643 |
| 4,092,588 | 5/1978 | Besormiere et al. | 204/192 E |
| 4,132,614 | 1/1979 | Cuomo et al. | 204/192 E |

OTHER PUBLICATIONS

Coburn "Increasing . . . Etching" IBM Technical Disclosure Bulletin, vol. 19, No. 10 (3/77) p. 3854.
Hitchner et al., "Polishing . . . Etching" IBM Technical Disclosure Bulletin, vol. 20, No. 11A (4/78) pp. 4560.
Schiable et al., "Reactive . . . Alloys" IBM Technical Disclosure Bulletin, vol. 21, No. 4 (9/78) pp. 1468.
Weissmantel et al., "New Developments . . . Techniques" Japan Journal of Applied Physics, Suppl. 2 pt 1 (1974) pp. 509–512.
Rost et al., "Ion Beam-. . . (PTFE)" Thin Solid Films, 20 (1974) pp. 515–519.
Frelser, "Effect of a Teflon . . . Plasma" J. Electrochemical Society, vol. 125 (6/78) p. 256C.

*Primary Examiner*—Jerome W. Massie
*Attorney, Agent, or Firm*—Jackson E. Stanland

[57] ABSTRACT

A method for etching materials in which a solid, located in the vicinity of the substrate, is used to provide reactive species for etching the substrate. In contrast with prior art etching techniques, an ion beam is provided which strikes a solid source located in the vicinity of the substrate. Reactive gas species are given off by the solid source when it is hit by the ion beam and these species etch the substrate. Etch rates can be enhanced or retarded depending upon the composition of the solid mask. The process has particular utility in etching generally active metals such as Ti, Nb, Ta, NiFe, etc. which undergo a large change in etch rate when mixed gases, such as argon plus $O_2$, $CF_4$, CO, or $CO_2$ (singularly or in combination) are used. As an example, solid TEFLON* can be used to surround the substrate during etching in order to generate active species, such as C and F, for etching of materials such as Ti, Si, NiFe, etc. Conductors and dielectrics can also be etched by this technique.

* A trademark of E. I. Du Pont de Nemours.

7 Claims, 3 Drawing Figures

MODIFICATION OF ETCH RATES BY SOLID MASKING MATERIALS

DESCRIPTION

1. Technical Field

This invention relates to processes and structure for etching materials, and more particularly to an etching technique wherein reactive gas species are provided by a solid mask located in the vicinity of the substrate to be etched.

2. Background Art

In the fabrication of electronic devices, such as magnetic bubble domain devices and semiconductor devices, it is often necessary to etch portions of layers of different materials used in the fabrication of these devices. For example, etching of films such as Ti, Nb, Ta, Si, NiFe, Al, Cu, Au, and dielectrics is often required to fabricate a complete device.

There are many techniques available for etching layers of materials, including sputter etching, plasma etching, and ion milling. When using any of these etching techniques, it is also desirable to be able to modify the etch rates in order to either enhance or decrease the etch rate of particular materials. Still further, it is desirable and often necessary to be able to accurately control the etching rate of a layer in order to ensure the uniformity of etching throughout the substrate and the quality of the finished product.

In etching processes of the type described, reactive gas species are propelled to strike the substrate which is to be etched. In particular, reactive gases, such as $F_2$, $O_2$, $CF_4$, $Cl_2$, $CO_2$, etc. are often mixed with an inert gas, such as Ar, to provide the etching gas. These reactive gas species strike the substrate and react therewith to produce volatile species which leave the substrate, thereby etching it.

In conventional etching processes of the type described, it is often difficult to provide large scale etching (i.e., over a large area) due to non-uniform etchant gas distribution, which causes a severe non-uniformity of etching over the large surface area. Further, in these prior art processes, it is often difficult to provide the right combination of inert gases and reactive gas species, since the proper combination depends upon the weight and density of these gases. An ionization gauge is used for determination of the gas mixture, but this is not always a precise determination. Further, use of certain gas species, such as $PF_3$, is hazardous and therefore avoided.

Another disadvantage with these prior art processes is that the etchant gas stream is more easily provided when positive specie producing reactive gases are to be used. If a negative species is to be used for etching, many electrons will also be produced by the ion gun and these cause excessive heating of the substrate and consequent damage. For example, it is difficult to get negative $CF_4$ from an ion beam gun, without also producing a considerable number of electrons. Instead, $CF_3^+$ will be produced by most of the available ion guns, but this will not react well with materials such as Si, Ti, etc. Therefore, the proper reactive gas species are often not easily created when an ion gun is used.

In the practice of the present invention, a technique has been discovered which allows the formation of desired reactive gas species without the difficulties encountered in the prior art techniques. Further, such reactive gas species are produced in the vicinity of the substrate to be etched, which provides increased uniformity and efficiency of etching.

Accordingly, it is a primary object of the present invention to provide an improved technique for etching materials.

It is another object of this invention to provide an improved substrate etching apparatus using a solid source of reactive etchant gases.

It is another object of the present invention to provide an improved etching technique which is useful in the fabrication of microelectronic devices.

It is yet another object of the present invention to provide an improved etching technique in which large surface areas can be accurately and uniformly etched.

It is a further object of the present invention to provide an etching technique using reactive gases, which is simple and which provides uniform reactive gas distribution over the entire substrate area to be etched.

It is another object of the present invention to provide an improved etching technique using reactive etchant gases, wherein different reactive gas mixtures can be easily provided.

It is another object of the present invention to provide a safe way for producing dangerous reactive gases in the vicinity of the sample to be etched.

DISCLOSURE OF THE INVENTION

An improved etching technique and apparatus is provided wherein different combinations of reactive gas species can be provided for etching a substrate. Rather than provide the reactive gases as part of an ion beam or as part of an input gas stream, an ion beam impinges upon a solid material which is located in the vicinity of the substrate. This solid material is a source of the reactive gas species and releases these species when the ion beam strikes it. The reactive gas species is released from the solid material, strikes the substrate to be etched, and causes release of volatile compounds therefrom.

This technique can be used to fabricate microelectronic structures, including magnetic bubble domain devices, semiconductor devices, Josephson tunnelling devices, and any other type of device in which accurate and reproducible substrate etching is required. Many different materials can be etched, and the etching rate can be modified by proper choice of composition, geometry, and location of the solid reactive gas species source, and by altering the pressure within the etching apparatus, etc.

In one example, a TEFLON (a trademark of Du Pont) mask is located around the sample to be etched and is struck by an input beam of pure argon (Ar) ions. When the teflon mask is hit by the argon ions, reactive gas species comprising C and F are released. These reactive species are released in the vicinity of the sample and strike the sample, thereby etching it.

These and other objects, features, and advantages will be more apparent from the following more particular description of the preferred embodiments.

BEST MODE FOR CARRYING OUT THE INVENTION

Figure 1:
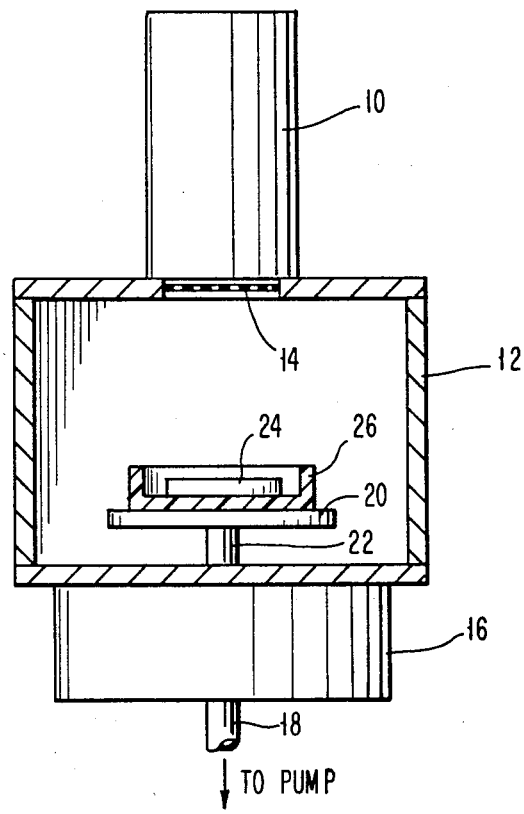
FIG. 1 shows a typical etching apparatus comprising a vacuum chamber, an ion beam source, a sample holder, and a solid source of reactive gases in accordance with the present invention.

FIG. 1 shows a typical apparatus for etching samples. This apparatus is comprised of an ion gun 10 located at the top of a working chamber 12. Grids 14 are provided in the bottom of ion gun 10, through which an ion beam can be provided. Below working chamber 12 is a liquid nitrogen trap 16, which is connected to a pump (not shown) through tubing 18. The working chamber 12 includes a substrate holder 20 which is supported by tubing 22.

In accordance with this invention, a sample 24 to be etched is surrounded by a solid source 26 of the reactive gases used for etching the surface of sample 24.

FIG. 1 is a schematic illustration of a customary etching apparatus, and for this reason much of the detail has been left out of this drawing. The component portions of this etching apparatus are well known in the art and are commercially available.

In operation, the ion gun 10 provides a beam of inert gas ions, such as $Ar^+$ ions. It is not necessary to use the ion gun for provision of reactive gas species, as is presently done in prior art etching systems. Instead, the solid source 26 is used to provide the reactive species for etching the surface of sample 24.

The ions from gun 10 strike solid source 26 and release reactive species therefrom which then strike the surface of sample 24. The composition of solid source 26 is selected to provide the species which are to be used to reactively etch sample 24. By choosing the proper composition, the etching of sample 24 can be either enhanced or retarded.

As an example, the sample can comprise a Ti film which is to be etched by a reactive gas species. If the solid source 26 is comprised of teflon, flouride reactive species will be produced when $Ar^+$ ions strike source 26. One of these reactive species is $CF_4$, which is a very good etchant for Ti films. By choosing the composition of the solid source 26, it is possible to vary the amount of different reactive species in the presence of the substrate 24. Since teflon is a particularly good source of carbon and flourine, it is a good solid source to use for etching many materials, including Ti, Si, Nb, Ta, NiFe, etc. For example, when F ions strike Ti, $TiF_4$ compounds are produced which are extremely volatile. In a similar manner, when F ions strike a Si film, volatile compounds of $SiF_4$ are produced.

In contrast with the conventional ion guns which are used to provide the reactive gas species, many different types of ions can be produced by a beam of inert gas ions striking solid source 26. This includes anions, cations, free radicals, etc. The spectrum of the reactive gases produced by the solid source depends upon the composition of the source and on the bombardment conditions. For example, the species driven off source 26 can be varied by changing the pressure in the working chamber 12, or by changing the composition of the ion beam from gun 10. Inert gases other than argon can be used, and the ion beam can also include gases such as oxygen, etc.

An important feature of the present invention is that negative ions can be produced for etching, which are not easily provided by an ion gun, without also providing excess electrons. Another important advantage is that the reactive species are produced in the immediate vicinity of the sample to be etched, and the distribution of the reactive species around the entire surface of the sample is very uniform. Still further, if the reactive gas is a dangerous one, provision of it from a solid source within working chamber 12 is much more safe than providing it as a gas within ion gun 10.

Figure 2:
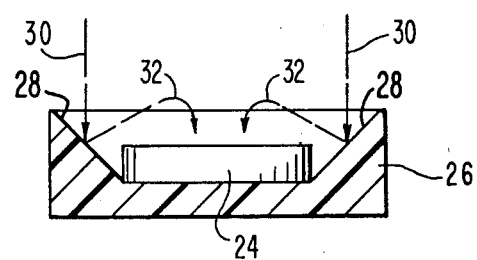
FIG. 2 shows an appropriate design of the solid source for providing reactive gases.

FIG. 2 shows a particular design for a solid source 26 to provide reactive gas species for etching the sample 24. In this figure, solid source 26 completely surrounds sample 24, and has a beveled edge 28. When the ion beam strikes edge 28, as illustrated by the arrows 30 depicting the motion of the $Ar^+$ ions, reactive species will be produced, such as $CF_4$. These species move to the top surface of sample 24, as illustrated by arrows 32. By changing the angle of the beveled edge 28, more or less of the released gas species will be delivered to the sample 24.

Generally, it is advisable to have the solid source 26 surround the substrate 24. This causes the reactive species to be produced throughout the area of the layer to be etched, which will provide more uniform etching. In the embodiment of FIG. 2, the angle of the beveled edge 28 can be adjusted to provide a suitable angle of deflection of the reactive species in order to ensure that a high percentage of these released reactive species are directed toward the sample 24.

Figure 3:
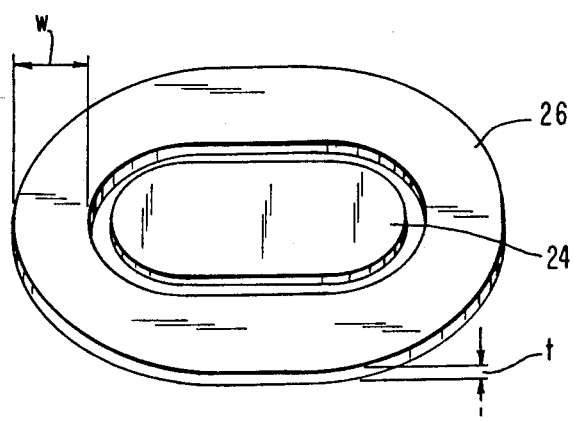
FIG. 3 shows another example of a solid source for providing reactive gases.

In FIG. 3, another embodiment is shown for a solid source 26, which surrounds the sample 24. In this case, sample 24 and solid source 26 have an oval shape, although the shape of the source 26 and sample 24 is not critical. Typically, the width w of source 26 is $\frac{1}{4}$–$\frac{1}{2}$ of the diameter of sample 24, while the thickness t of source 26 is typically 1–5 times the thickness of the sample 24.

The source and sample shown in FIG. 3 were used to etch NiFe using a source 26 of teflon. The width of source 26 was approximately $\frac{1}{4}$ of the diameter of the sample, while ion milling of the sample was carried out under standard conditions. These standard conditions included an $Ar^+$ pressure in chamber 12 of about $1 \times 10^{-4}$ torr. The etch rate of Ti in pure Ar, with sample 24 resting on a Mo table, was 81 Å/minute. When this same sample was surrounded by a teflon solid source 26, as shown in FIG. 3, the etch rate was reduced to 48 Å/minute.

The concept of the present invention can be used to etch metal films, and other films, for fabrication of various types of devices. As an example, magnetic bubble domain devices use two metal layers, the bottom layer being a conductor (such as gold) and the top layer being of a magnetic material, such as NiFe. NiFe is often used as a mask during ion milling of the gold layer, in order to define current carrying conductors. The NiFe layer can be patterned by ordinary ion milling, and after this a solid teflon source 26 can be lowered into position surrounding the bubble domain devices. Continuation of the ion milling in the presence of the solid source 26 will cause active gases to be generated from the teflon when it is struck by the ion beam. These active gases will slow down the etch rate of NiFe while the gold layer etching is affected in only a minor way. In general, noble metals, such as gold, etch at constant rates in the presence of different reactive gases, and therefore their etching rates would not be significantly changed by the presence of most solid sources 26.

What has been described is a means and method for providing improved etching of materials, where reactive gas species used to etch these materials are provided by a solid source, usually located in the vicinity of the material to be etched. Typically, the solid source surrounds the sample to be etched, although this is not strictly necessary. Further, the solid source need not be of a single piece, but can be provided by a plurality of solids, having the same or different composition. Of course, the solid source can be located away from the sample, but this is not usually advantageous.

In the practice of this invention, it is much simpler to provide an ion beam which is comprised of inert gas ions, rather than providing an ion beam that is comprised of some reactive gas species. However, the exact composition of the ion beam can be varied and can include reactive gas species, as well as different types of inert gases. Still further, the geometry of the solid source 26, and its proximity to the sample to be etched can also be varied.

In the further practice of the present invention, conductors are also readily etched by reactive gas species released from a solid source. For example, conductors such as Al, Au, Cu, and Al-Cu alloys are readily etched by reactive chlorine species. For these conductors, the solid source is conveniently a polyvinyl chloride solid which, when hit by an ion beam, will release chlorine species that strike the conductor to etch it.

Another suitable source is one comprising polyvinyl bromide, which when hit by an ion beam will release bromine, which is also a good etchant gas. The bromine that is released can be in the form of bromine gas, bromine in an excited state, bromine as a free radical, etc. A mass spectrometer is used to determine the species which is given off. By regulating the argon beam intensity, etc., it is possible to regulate the species which are readily released from the solid source.

In the further practice of this invention, it is useful to mix oxygen gas with the ion beam in order to ensure that halogens are the species primarily released when the solid source is struck by the ion beam. For example, in the case of a teflon solid source oxygen will combine with carbon in the solid source to produce carbon dioxide or carbon monoxide. This means that the reactive etching species, such as $CF_4$, will be the species primarily released and therefore etching of the layer will occur at an enhanced rate.

Dielectric films, such as $SiO_2$ and $Si_3N_4$, can also be etched by this technique. For example, HF is a good etchant, which can be provided by a solid source. A parafin wax source can be used to provide H, which will combine with F from Teflon. Of course, the H can be provided in the ion beam.

Another good etchant gas is $PF_3$, which is very dangerous in gaseous form. However, it can be safely provided close to the sample to be etched by solid sources containing P and F.

The following materials are useful as solid sources for providing reactive gas species:
formvar $(C_5H_7O_2)_x$
polypropylene $(CH_2)_x$
cellulose acetate $(C_{10}H_{21}O_{15})_x$
Mylar $(C_{10}H_8O_4)_x$
Teflon $(CF_2)$
Polystyrene $(CH)_x$
Nylon $(C_{12}H_{12}O_3N_2)_x$
Vyns $(C_{22}H_{33}O_2Cl_9)_x$
Saran $(C_2H_2Cl_2)_x$ Generally, halogen reactive gas species are very useful for etching many materials, including metals and dielectrics. However, those of skill in the art will understand that the principles of the present invention can be expanded for etching other materials using any types of reactive gas species.

Having thus described our invention, what we claim as new, and desire to secure by Letters Patent is:

1. A method for etching a sample of material using a reactive gas species, including the steps of:

locating a sample within a chamber in the close proximity of a non-metallic solid source which surrounds said sample and which is capable of releasing said reactive gas species when struck by an ion beam created externally from said chamber and accelerated into said chamber, wherein said sample and said solid source are struck by said ion beam, directly striking said sample and said solid source with said ion beam to release said reactive gas species from said solid source, said reactive gas species traveling to said sample, etching said sample of material with said released gas species, which chemically reacts with said sample to form volatile species that leave said sample, thereby causing etching of said sample.

2. The method of claim 1, wherein said solid source is chosen from the group consisting of
   formvar $(C_5H_7O_2)_x$
   polypropylene $(CH_2)_x$
   cellulose acetate $(C_{10}H_{21}O_{15})_x$
   Mylar $(C_{10}H_8O_4)_x$
   Teflon $(CF_2)$
   polystyrene $(CH)_x$
   nylon $(C_{12}H_{12}O_3N_2)_x$
   Vyns $(C_{22}H_{33}O_2Cl_9)_x$
   saran $(C_2H_2Cl_2)_x$
   Polyvinylbromide
   Polyvinylchloride
   paraffin Wax
   and a solid source containing P and F.

3. The method of claim 1, where said sample to be etched is a metal, and said reactive gas species is that which reacts with said metal to produce volatile species to be released from said metal.

4. The method of claim 1, where said solid source contains carbon and flourine.

5. The method of claim 1, wherein said sample is chosen from the group consisting essentially of Ti, Si, Nb, Ta, Al, Cu, Au, Al-Cu alloys, dielectrics, and NiFe, and said ion beam is a beam of inert gas ions.

6. The method of claim 1, where said ion beam strikes said solid source along a beveled edge thereof to release said reactive gas species at an angle which brings them to the vicinity of the surface of said sample to be etched.

7. The method of claim 1, where said ion beam produces a beam of inert gas ions, and said solid source is comprised of a halogen.

* * * * *